United States Patent
Wang et al.

(10) Patent No.: US 11,287,493 B2
(45) Date of Patent: Mar. 29, 2022

(54) MAGNETIC RESONANCE IMAGING METHOD AND SYSTEM AND COMPUTER-READABLE STORAGE MEDIUM

(71) Applicant: GE Precision Healthcare LLC, Wauwatosa, WI (US)

(72) Inventors: Longqing Wang, Beijing (CN); Weinan Tang, Beijing (CN); Kun Wang, Beijing (CN); Hongbin Wang, Beijing (CN); Yongchuan Lai, Beijing (CN); Jiabin Yao, Beijing (CN)

(73) Assignee: GE Precision Healthcare LLC, Wauwatosa, WI (US)

(*) Notice: Subject to any disclaimer, the term of this patent is extended or adjusted under 35 U.S.C. 154(b) by 0 days.

(21) Appl. No.: 17/065,058

(22) Filed: Oct. 7, 2020

(65) Prior Publication Data
US 2021/0123993 A1 Apr. 29, 2021

(51) Int. Cl.
*G01V 3/00* (2006.01)
*G01R 33/24* (2006.01)
(Continued)

(52) U.S. Cl.
CPC ......... *G01R 33/246* (2013.01); *G01R 33/243* (2013.01); *G01R 33/4835* (2013.01); *G01R 33/543* (2013.01)

(58) Field of Classification Search
CPC .............. G01R 33/543; G01R 33/5659; G01R 33/3415; G01R 33/36; A61B 5/055
(Continued)

(56) References Cited

U.S. PATENT DOCUMENTS

| 4,987,371 A | 1/1991 | Glover |
|---|---|---|
| 8,198,891 B2 | 6/2012 | Sacolick |

(Continued)

FOREIGN PATENT DOCUMENTS

JP  2015058146 A  3/2015

OTHER PUBLICATIONS

Duan et al., "Fast Simultaneous B0/B1 Mapping by Bloch-Siegert Shift with Improved Gradient Scheme and Pulse Design," Proc. Intl. Soc. Mag. Reson. Med.2012, 1 page.

*Primary Examiner* — Walter L Lindsay, Jr.
*Assistant Examiner* — Frederick Wenderoth

(57) ABSTRACT

Embodiments of the present invention provide a magnetic resonance imaging method and system and a computer-readable storage medium. The method comprises: performing pre-scanning, wherein a first sequence and a second sequence are separately performed on a plurality of slices; in the first sequence, two echoes are continuously obtained to respectively obtain first image data and second image data having a first phase offset; in the second sequence, two echoes are continuously obtained to respectively obtain third image data and fourth image data having a second phase offset, the first phase offset and the second phase offset having opposite directions but the same angle; obtaining a plurality of radio-frequency field maps respectively corresponding to the plurality of slices based on the first image data and the second image data, and obtaining a plurality of static magnetic field maps respectively corresponding to the plurality of slices based on at least one of the following two groups: a first image and a third image, and a second image and a fourth image; and calculating formal scanning parameters suitable for a corresponding slice based on at least one of the following two components: each radio-frequency field map, and a corresponding static magnetic field map.

23 Claims, 6 Drawing Sheets

(51) Int. Cl.
*G01R 33/483* (2006.01)
*G01R 33/54* (2006.01)

(58) Field of Classification Search
USPC .......................................................... 324/309
See application file for complete search history.

(56) References Cited

U.S. PATENT DOCUMENTS

| | | | |
|---|---|---|---|
| 2010/0127703 A1* | 5/2010 | Sung | A61B 5/055 |
| | | | 324/309 |
| 2011/0245655 A1* | 10/2011 | Abe | G01R 33/565 |
| | | | 600/410 |
| 2012/0321162 A1* | 12/2012 | Liu | G01R 33/5616 |
| | | | 382/131 |
| 2016/0047876 A1* | 2/2016 | Alhamud | G01R 33/56509 |
| | | | 324/309 |
| 2016/0282438 A1* | 9/2016 | Sun | G01R 33/583 |

* cited by examiner

FIG. 1 (DRAWING FOR ABSTRACT)

MAGNETIC RESONANCE IMAGING METHOD AND SYSTEM AND COMPUTER-READABLE STORAGE MEDIUM

CROSS-REFERENCE TO RELATED APPLICATIONS

This application claims the benefit of CN Patent Application No. 201911028768.9 filed on Oct. 28, 2019, the disclosure of which is herein incorporated by reference in its entirety.

TECHNICAL FIELD

Embodiments disclosed in the present invention relate to medical imaging technologies, and more specifically, to a method and system for magnetic resonance imaging.

BACKGROUND

Magnetic resonance imaging (MRI), as a medical imaging modality, can obtain images of the human body without using X-rays or other ionizing radiation. MRI uses a magnet having a strong magnetic field to generate a static magnetic field B0. When a to-be-imaged part of the human body is positioned in the static magnetic field B0, nuclear spin associated with hydrogen nuclei in human tissue is polarized. The tissue of the to-be-imaged part thus generates a longitudinal magnetization vector at a macroscopic level. After a radio-frequency field B1 intersecting the direction of the static magnetic field B0 is applied, the direction of rotation of protons changes so that the tissue of the to-be-imaged part generates a transverse magnetization vector at a macroscopic level. After the radio-frequency field B1 is removed, the transverse magnetization vector decays in a spiral manner until it is restored to zero. A free induction decay signal is generated during decay. The free induction decay signal can be acquired as a magnetic resonance signal, and a tissue image of the to-be-imaged part can be reconstructed based on the acquired signal.

Magnetic resonance imaging can be applied to variety of scenarios based on different imaging purposes. In some of the applications, the uniformity of the static magnetic field B0 and the radio-frequency field B1 is highly sensitive. In other words, in these applications, the non-uniformity of the static magnetic field B0 and the radio-frequency field B1 has a significant impact on the imaging effect. Examples of these applications include water-fat separation, where fat tissue signals are inhibited to highlight lesion tissue in the image.

There are various factors that cause non-uniformity of the static magnetic field B0 and the radio-frequency field B1. For example, a dielectric effect caused by a patient's body or a short body coil design may cause non-uniformity of the radio-frequency field B1, the body size of the patient affects the static magnetic field B0, failure of shimming based on data in the entire space of the static magnetic field B0 causes shimming inaccuracy of the B0 field, and so on. These factors may be present, rendering it more difficult to improve imaging quality by improving the uniformity of the static magnetic field B0 and the radio-frequency field B1.

SUMMARY

An embodiment of the present invention provides a magnetic resonance imaging method, comprising: performing pre-scanning, wherein a first sequence and a second sequence are separately performed on a plurality of slices; in the first sequence, two echoes are continuously obtained to respectively obtain first image data and second image data having a first phase offset; in the second sequence, two echoes are continuously obtained to respectively obtain third image data and fourth image data having a second phase offset, the first phase offset and the second phase offset having opposite directions but the same angle; obtaining a plurality of radio-frequency field maps respectively corresponding to the plurality of slices based on the first image data and the second image data, and obtaining a plurality of static magnetic field maps respectively corresponding to the plurality of slices based on at least one of the following two groups: the first image and the third image, and the second image and the fourth image; and calculating formal scanning parameters suitable for a corresponding slice based on at least one of the following two components: each radio-frequency field map, and a corresponding static magnetic field map.

Optionally, a radio-frequency field map of a corresponding slice is obtained based on one of the following two components: a data difference between the first image data and the second image data, and a data difference between the third image data and the fourth image data.

Optionally, a static magnetic field map of a corresponding slice is obtained based on at least one of the following two components: a data difference between the first image data and the third image data, and a data difference between the second image data and the fourth image data.

Optionally, the calculating formal scanning parameters suitable for a corresponding slice comprises: calculating, based on the static magnetic field map of the corresponding slice, a central frequency and a gradient shimming value suitable for the slice.

Optionally, the calculating formal scanning parameters suitable for a corresponding slice comprises: calculating, based on the radio-frequency field map of the corresponding slice, a transmit gain suitable for the slice.

Optionally, in the first sequence, a first phase-shifting pulse is applied before the echoes; in the second sequence, a second phase-shifting pulse is applied before the echoes; a frequency of the first phase-shifting pulse has a positive offset from a currently used resonant frequency; a frequency of the second phase-shifting pulse has a negative offset from the currently used resonant frequency; and the frequencies of the first phase-shifting pulse and the second phase-shifting pulse have the same offset amplitude as the currently used resonant frequency, so that the third image data and the first image data as well as the fourth image data and the second image data generate phase offsets with opposite directions but the same angle.

Optionally, the first phase-shifting pulse and the second phase-shifting pulse are Fermi pulses.

Optionally, the plurality of slices are some slices selected from a series of slices scanned in formal scanning, and the method further comprises: estimating formal scanning parameters of unselected slices based on formal scanning parameters of the selected slices.

Optionally, the formal scanning parameters of the unselected slices are estimated by performing an interpolation algorithm based on the formal scanning parameters of the selected slices.

Optionally, the pre-scanning is performed using reference scanning parameters, and the formal scanning parameters suitable for the corresponding slice are calculated based on the reference scanning parameters and at least one of the following two components: each radio-frequency field map, and the corresponding static magnetic field map.

Optionally, the method further comprises: obtaining a mask image based on the first image data, the second image data, the third image data, or the fourth image data, and removing data of tissue of no interest in the static magnetic field maps and the radio-frequency field maps based on the mask image; and the step of calculating formal scanning parameters of a corresponding slice comprises: calculating the formal scanning parameters suitable for the slice based on at least one of the following two components: each radio-frequency field map with data of tissue of no interest removed, and the corresponding static magnetic field map.

Another embodiment of the present invention further provides a magnetic resonance imaging method, comprising:

performing pre-scanning, wherein a first sequence and a second sequence are separately performed on a plurality of slices; in the first sequence, a first phase-shifting pulse is applied after a radio-frequency transmit pulse, and two echoes are continuously obtained after the first phase-shifting pulse to respectively obtain first image data and second image data; in the second sequence, a second phase-shifting pulse is applied after a radio-frequency transmit pulse, and two echoes are continuously obtained after the second phase-shifting pulse to respectively obtain third image data and fourth image data, frequencies of the first phase-shifting pulse and the second phase-shifting pulse having offsets with the same amplitude with frequencies of the radio-frequency transmit pulses but opposite directions from frequencies of the radio-frequency transmit pulses;

obtaining a plurality of radio-frequency field maps respectively corresponding to the plurality of slices based on the first image data and the second image data, and obtaining a plurality of static magnetic field maps respectively corresponding to the plurality of slices based on at least one of the following two groups: the first image and the third image, and the second image and the fourth image; and calculating formal scanning parameters suitable for a corresponding slice based on at least one of the following two components: each radio-frequency field map, and a corresponding static magnetic field map.

Another embodiment of the present invention further provides a magnetic resonance imaging system, comprising:

a scanner;

a controller unit, configured to control the scanner to perform pre-scanning, wherein the pre-scanning comprises: separately performing a first sequence and a second sequence on a plurality of slices; in the first sequence, continuously obtaining two echoes to respectively obtain first image data and second image data having a first phase offset; and in the second sequence, continuously obtaining two echoes to respectively obtain third image data and fourth image data having a second phase offset, the first phase offset and the second phase offset having opposite directions but the same angle; and a data processing unit, configured to: obtain a plurality of radio-frequency field maps respectively corresponding to the plurality of slices based on the first image data and the second image data, obtain a plurality of static magnetic field maps respectively corresponding to the plurality of slices based on at least one of the following two groups: a first image and a third image, and a second image and a fourth image; and calculate formal scanning parameters suitable for a corresponding slice based on at least one of the following two components: each radio-frequency field map, and a corresponding static magnetic field map.

Optionally, the data processing unit is configured to obtain a radio-frequency field map of a corresponding slice based on one of the following two components: a data difference between the first image data and the second image data, and a data difference between the third image data and the fourth image data.

Optionally, the data processing unit is configured to obtain a static magnetic field map of a corresponding slice based on at least one of the following two components: a data difference between the first image data and the third image data, and a data difference between the second image data and the fourth image data.

Optionally, the data processing unit is configured to calculate, based on the static magnetic field map of the corresponding slice, a central frequency and a gradient shimming value suitable for the slice.

Optionally, the data processing unit is configured to calculate, based on the radio-frequency field map of the corresponding slice, a transmit gain suitable for the slice.

Optionally, in the first sequence, a first phase-shifting pulse is applied before the echoes; in the second sequence, a second phase-shifting pulse is applied before the echoes; a frequency of the first phase-shifting pulse has a positive offset from a currently used resonant frequency; a frequency of the second phase-shifting pulse has a negative offset from the currently used resonant frequency; and the frequencies of the first phase-shifting pulse and the second phase-shifting pulse have the same offset amplitude as the currently used resonant frequency, so that the third image data and the first image data as well as the fourth image data and the second image data generate phase offsets with opposite directions but the same amplitude.

Optionally, the first phase-shifting pulse and the second phase-shifting pulse are Fermi pulses.

Optionally, the plurality of slices are some slices selected from a series of slices scanned in formal scanning, and the data processing unit is configured to estimate formal scanning parameters of unselected slices based on formal scanning parameters of the selected slices.

Optionally, the formal scanning parameters of the unselected slices are estimated by performing an interpolation algorithm based on the formal scanning parameters of the selected slices.

Optionally, the controller unit controls the scanner to perform the pre-scanning using reference scanning parameters, and the data processing unit calculates the formal scanning parameters suitable for the corresponding slice based on the reference scanning parameters and at least one of the following two components: each radio-frequency field map, and the corresponding static magnetic field map.

Optionally, the data processing unit is configured to:

obtain a mask image based on the first image data, the second image data, the third image data, or the fourth image data;

remove data of tissue of no interest in the static magnetic field maps and the radio-frequency field maps based on the mask image; and calculate the formal scanning parameters suitable for the corresponding slice based on at least one of the following two components: each radio-frequency field map with data of tissue of no interest removed, and the corresponding static magnetic field map.

Another embodiment of the present invention may further provide a computer-readable storage medium, for storing computer-readable instructions, wherein when the computer-readable instructions are executed, the method according to any of the alternative embodiments described above is implemented.

It should be understood that the brief description above is provided to introduce in simplified form some concepts that will be further described in the Detailed Description of the Embodiments. The brief description above is not meant to identify key or essential features of the claimed subject matter. The protection scope is defined uniquely by the claims that follow the detailed description. Furthermore, the claimed subject matter is not limited to implementations that solve any disadvantages noted above or in any section of the present disclosure.

BRIEF DESCRIPTION OF THE DRAWINGS

The present invention will be better understood by reading the following description of non-limiting embodiments with reference to the accompanying drawings, where.

DETAILED DESCRIPTION OF THE EMBODIMENTS

Figure 1:
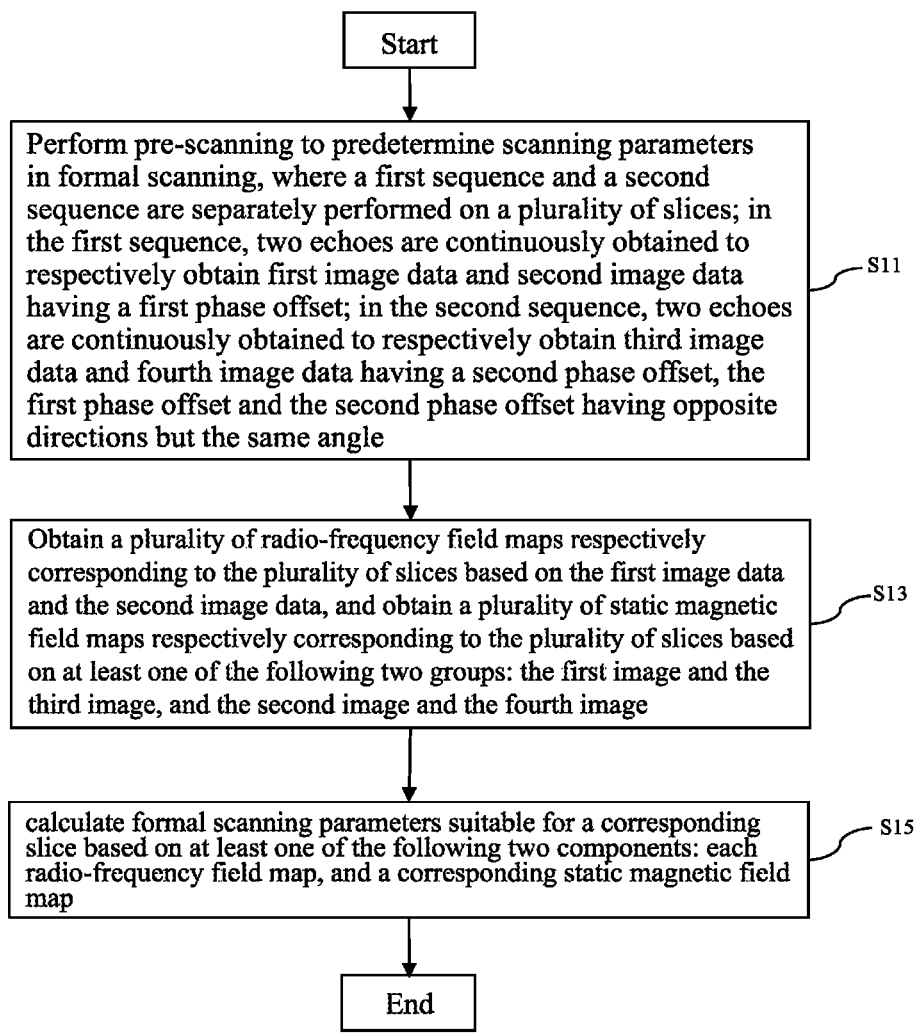
FIG. 1 is a flowchart of a magnetic resonance imaging method according to an embodiment of the present invention.

FIG. 1 is a flowchart of a magnetic resonance imaging method according to an embodiment of the present invention. As shown in FIG. 1, the method includes steps S11, S13, and S15.

Step S11: perform pre-scanning to predetermine scanning parameters in formal scanning, where the scanning parameters may include, for example, a radio-frequency transmit gain, a central frequency, and a gradient shimming value. The radio-frequency transmit gain reflects a radio-frequency transmit power and determines radio-frequency energy transmitted to a detected patient's body. The central frequency is a resonant frequency of protons of tissue of interest. Due to non-uniformity of a static magnetic field, central frequencies needed at different positions may vary. The image quality can thus be improved by setting more accurate central frequencies for different slice positions. For example, in a fat inhibition technique, in order to inhibit fat tissue, protons of the fat tissue need to resonate first, and the fat inhibition effect can be obviously improved by using an accurate resonant frequency. The gradient shimming value may include an increased value or decreased value of a current applied to a shim coil (gradient coil), so as to compensate for non-uniformity of the static magnetic field by increasing or decreasing the current in the shim coil.

In the aforementioned pre-scanning, a first sequence and a second sequence are separately performed on a plurality of slices.

Those skilled in the art can understand that the "sequence" refers to a combination of pulses having specific amplitudes, widths, directions, and time sequences and applied when magnetic resonance imaging is performed. The pulses may usually include, for example, a radio-frequency pulse and a gradient pulse. The radio-frequency pulse may include, for example, a radio-frequency transmit pulse for exciting protons in the human body to resonate, and the gradient pulse may include, for example, a slice selection gradient pulse, a phase encoding gradient pulse, and a frequency encoding gradient pulse.

Figure 2:
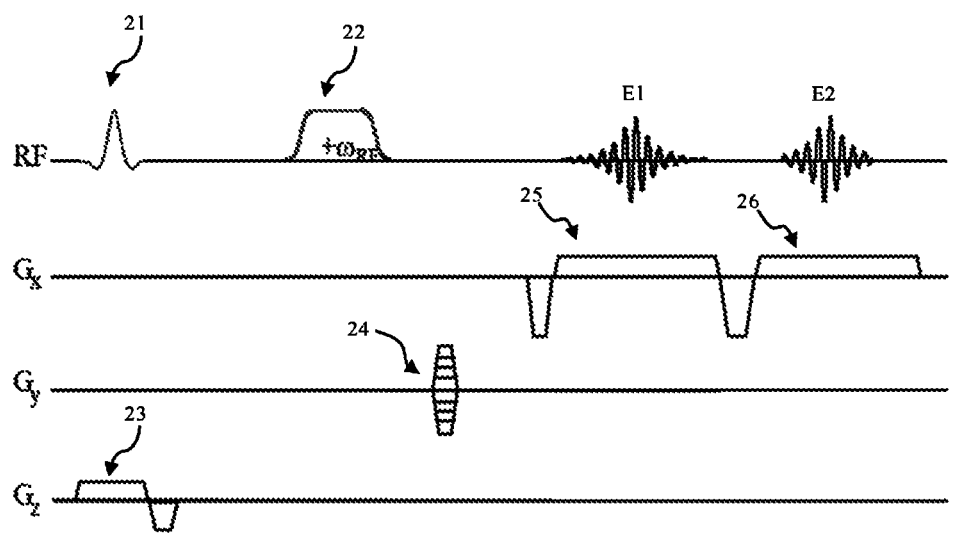
FIG. 2 illustrates an example of a first sequence applied to the method shown in FIG. 1.
Figure 3:
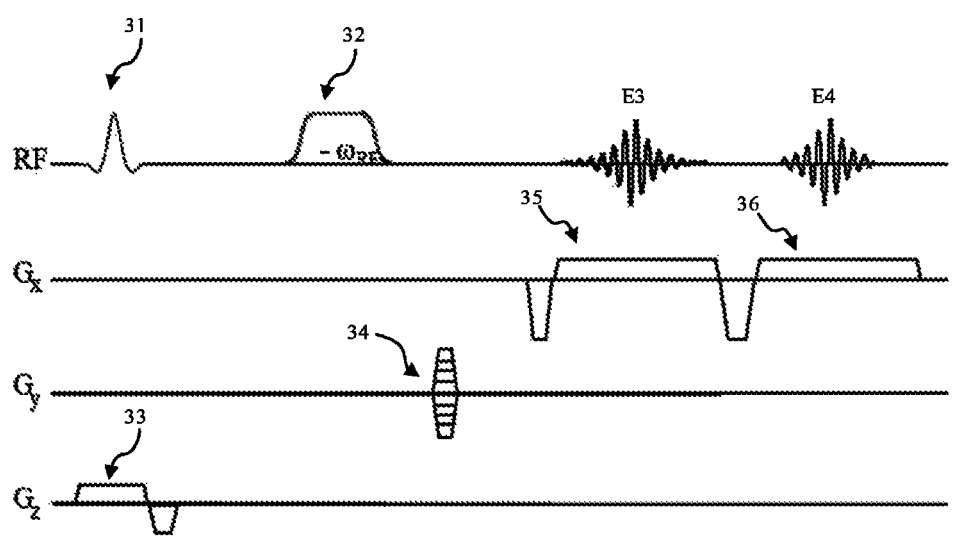
FIG. 3 illustrates an example of a second sequence applied to the method shown in FIG. 2.

FIG. 2 illustrates an example of the first sequence, and FIG. 3 illustrates an example of the second sequence. It should be understood that the illustrated first sequence and second sequence are merely some of sequences for performing pre-scanning. For example, FIG. 1 and FIG. 2 only illustrate sequences within one repetition time (TR), and those skilled in the art can understand that the repetition time refers to a time interval between two adjacent radio-frequency transmit pulses of an imaging sequence. The sequences shown in FIG. 2 and FIG. 3 may further include other pulses, and the other pulses may be, for example, located between any two adjacent pulses. The example of the present invention is used only for illustrating the sequential relationship between the pulses shown in FIG. 2 and FIG. 3, rather than limiting the sequential relationship between these pulses and other pulses not shown.

As shown in FIG. 2, two echoes E1 and E2 are continuously obtained within each repetition time of the first sequence to obtain first image data T1 and second image data T2. The word "continuously" may mean that no other sequence pulses are performed in the process that the two echoes are successively performed. As an example, a radio-frequency transmit pulse 21 is included within each repetition time of the first sequence. The radio-frequency transmit pulse 21 may have a flip angle of 90 degrees and is used for controlling a radio-frequency transmit coil of a magnetic resonance imaging system to transmit a radio-frequency signal to a patient. The radio-frequency signal has a preset central frequency (resonant frequency) to excite resonance of protons of tissue of interest. A first phase-shifting pulse 22 is further included after the radio-frequency transmit pulse 21. The first phase-shifting pulse 22 is used for controlling the radio-frequency transmit coil of the magnetic resonance imaging system to transmit a radio-frequency signal to the patient. A frequency of the radio-frequency signal has a slight positive offset (for example, +(1–2) kHZ) from the resonant frequency (for example, a frequency of the radio-frequency transmit pulse 21), so that positive phase shifts of echo signals are generated without directly exciting proton resonance; that is, the first image data and the second image data have a first phase offset (with respect to image data generated when the first phase-shifting pulse 22 is not applied).

A slice selection gradient pulse 23 emitted simultaneously with the radio-frequency transmit pulse 21 is further included within each repetition time of the first sequence. The slice selection gradient pulse 23 is used for controlling a gradient coil in a Z direction of the magnetic resonance imaging system to apply a gradient to a static magnetic field B0, so as to provide position information in the Z direction to the first image data and the second image data. A phase encoding gradient pulse 24 is further included after the slice selection gradient pulse 23 and used for controlling a gradient coil in a Y direction to apply a gradient to the static magnetic field B0, so as to provide position information in the Y direction to the first image data and the second image data. Frequency encoding gradient pulses 25 & 26 are further included after the phase encoding gradient pulse 24 and are also referred to as read gradient pulses and used for controlling a gradient coil in an X direction of the magnetic resonance imaging system to apply a gradient to the static magnetic field B0, so as to provide position information in the X direction to the first image data and the second image data respectively. The first echo E1 and the second echo E2, namely, free induction decay signals generated due to spin of excited protons in the human body, are respectively generated along with/in response to the frequency encoding gradient pulses 25 & 26.

As shown in FIG. 3, the second sequence is similar to the first sequence and includes a radio-frequency transmit pulse 31, a second phase-shifting pulse 32, a slice selection gradient pulse 33, a phase encoding gradient pulse 34, and frequency encoding gradient pulses 35 & 36. Moreover, two echoes E3, E4 are continuously obtained within each repetition time of the second sequence so as to respectively obtain third image data and fourth image data. The second sequence differs from the first sequence in that a frequency of the second phase-shifting pulse 32 has a slight negative offset (for example, −(1–2) kHZ) from the resonant frequency, so that negative phase shifts of echo signals are generated without directly exciting proton spin, and then the third image data and the fourth image data have a second phase offset (with respect to image data generated when the second phase-shifting pulse 32 is not applied), and the second phase offset and the first phase offset have the same angle but opposite directions.

The aforementioned first phase-shifting pulse and second phase-shifting pulse are preferably Fermi pulses. As shown in FIG. 2 and FIG. 3, the Fermi pulse has an off-resonant frequency, and the amplitude thereof may be characterized by being flat in the middle and decreasing exponentially from the middle to two sides.

The plurality of slices described above may be some slices selected according to certain rules from a series of slices scanned in formal scanning. For example, several slices on which the first sequence and the second sequence are not performed may further be provided between selected adjacent slices.

Step S13: respectively obtain a plurality of radio-frequency field maps corresponding to the plurality of slices based on the first image data and the second image data (or the third image data and the fourth image data), and respectively obtain a plurality of static magnetic field maps corresponding to the plurality of slices based on at least one of the following two groups: the first image data and the third image data, and the second image data and the fourth image data.

A static magnetic field map, namely, B0 Map, reflects the spatial distribution of a static magnetic field. Since the magnitude of the applied static magnetic field affects the angular velocity of deflection of a longitudinal magnetization vector of protons, and then the magnitude of the static magnetic field has a specific functional relationship with the phase change of a magnetic resonance signal over time, the static magnetic field map may be obtained through differences between magnetic resonance signals acquired at the same position at different moments. For example, a phase difference between first image data and second image data obtained at one slice is calculated so that a static magnetic field map corresponding to the slice can be obtained.

A radio-frequency field map, namely, B1 Map, reflects the spatial distribution of a radio-frequency field. After the aforementioned first and second phase-shifting pulses are applied, the phase change of the magnetic resonance signal over time is not only affected by the static magnetic field but also affected by the phase-shifting pulses. Then, an image (for example, a first image) obtained by performing the first sequence and an image (for example, a third image) obtained by performing the second sequence are subtracted, so that the static magnetic field factor in the phase change can be eliminated, keeping only the phase-shifting pulse factor. Since the amplitude of the phase-shifting pulse has a specific functional relationship with the value of the radio-frequency field B1, a phase difference between the first image data and the third image data is obtained or a phase difference between the second image data and the fourth image data is obtained, so that a radio-frequency field map corresponding to each slice can be obtained.

Step S15: calculate formal scanning parameters suitable for a corresponding slice based on at least one of the following two components: each radio-frequency field map, and each static magnetic field map.

In step S11, the pre-scanning may be performed using reference scanning parameters, where the reference scanning parameters may include, for example, a reference flip angle, a reference transmit gain, and a reference central frequency used when pre-scanning is performed, and in S15, the formal scanning parameters suitable for the corresponding slice are further calculated based on the reference scanning parameters and at least one of the following two components: each radio-frequency field map, and the corresponding static magnetic field map.

For example, a transmit gain suitable for a corresponding slice may be calculated based on each radio-frequency field map. In an example, a distribution map of flip angles may be obtained based on the radio-frequency field map, and then an average of the flip angles in the slice is further calculated. The transmit gain suitable for the corresponding slice may be calculated in the following manner: first, Delta TG is calculated using the following formula (1).

$$\text{Delta } TG = -200 * \log 10(R/R0) \quad (1)$$

where Delta TG is an offset value with respect to the reference transmit gain set when the aforementioned pre-scanning is performed, R is the average of the flip angles calculated based on the radio-frequency field map, and R0 is the flip angle set when the aforementioned pre-scanning is performed. The aforementioned offset value is added to the reference transmit gain to obtain the transmit gain suitable for the slice in formal scanning.

An offset value with respect to a central frequency suitable for a corresponding slice may be calculated based on each static magnetic field map, and is an offset value with respect to the reference central frequency set when pre-scanning is performed. The offset value is added to the reference central frequency set in pre-scanning, so as to obtain the central frequency suitable for the slice in formal scanning.

Those skilled in the art should understand that a gradient shimming value suitable for a corresponding slice may further be calculated based on each static magnetic field map. In formal scanning, the current in a corresponding gradient coil (for example, a gradient coil Gx, Gy, or Gz) is controlled based on the calculated gradient shimming value, so as to apply a compensating magnetic field in three dimensions to the non-uniform static magnetic field to shim the static magnetic field.

Figure 4:
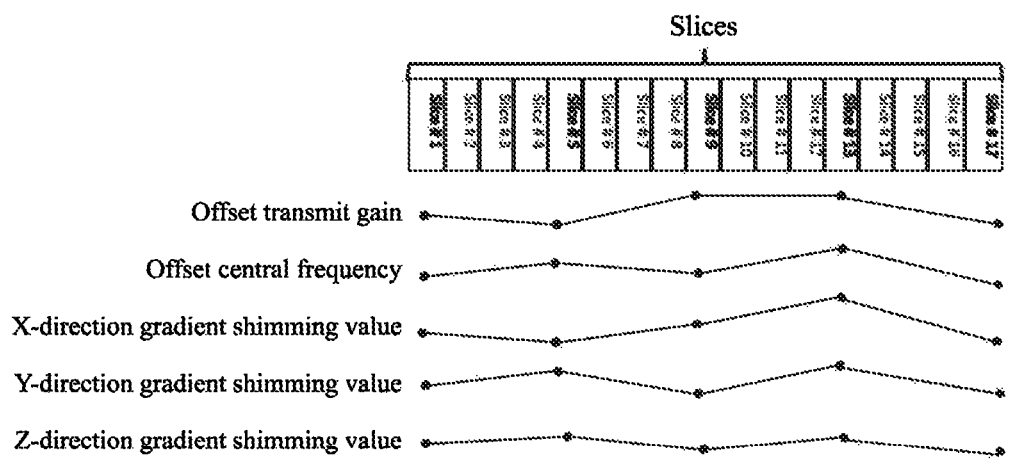
FIG. 4 is a schematic diagram of selecting some of a series of slices to determine corresponding formal scanning parameters and determining formal scanning parameters of unselected slices based on the formal scanning parameters.

As described above, the plurality of slices on which the aforementioned second sequence and third sequence are performed are selected according to certain rules from a series of slices. FIG. 4 is a schematic diagram of selecting some (for example, Slice #1, Slice #5, Slice #9, Slice #13, and Slice #17) of a series of slices (for example, Slices #1-17) to determine corresponding formal scanning parameters and determining formal scanning parameters of unselected slices based on the formal scanning parameters. As shown in FIG. 4, the formal scanning parameters of the unselected slices may be estimated based on the formal scanning parameters of the selected slices. For example, the formal scanning parameters of the unselected slices are estimated by performing an interpolation algorithm based on the formal scanning parameters of the selected slices.

Optionally, a mask image may further be obtained based on the aforementioned first image data, second image data, third image data, or fourth image data, and data of tissue of no interest in the static magnetic field maps and the radio-frequency field maps may be removed based on the mask image. Then, in step S15, the step of calculating formal scanning parameters of a corresponding slice includes: calculating the formal scanning parameters suitable for the slice based on at least one of the following two components: each radio-frequency field map with data of tissue of no interest removed, and the corresponding static magnetic field map with data of tissue of no interest removed. For example, pixel regions related to an imaged object can be extracted based on contour features in the mask image. Then, only data of the pixel regions is extracted in the static magnetic field map and the radio-frequency field map, and subsequent calculation of formal scanning parameters may be performed based on the extracted data, so that more accurate formal scanning parameters can be obtained and interference from data other than tissue of interest can be avoided.

In the embodiment of the present invention, in performing the aforementioned first sequence and second sequence, signals are received from the scanned patient's body preferably through a radio-frequency surface coil to obtain the aforementioned first image data, second image data, third image data, and fourth image data, so as to further obtain the aforementioned static magnetic field map and radio-frequency field map. Because of a high signal-to-noise ratio, a more accurate static magnetic field map is obtained as compared with the conventional manner of receiving signals using a body coil to obtain a static magnetic field map.

In addition, two sequences are performed on the same slice, and two echoes are performed in one sequence, so that both a radio-frequency field map and a static magnetic field map can be obtained from signals received through the surface coil, thereby avoiding separate scanning for obtaining the two field maps.

Figure 5:
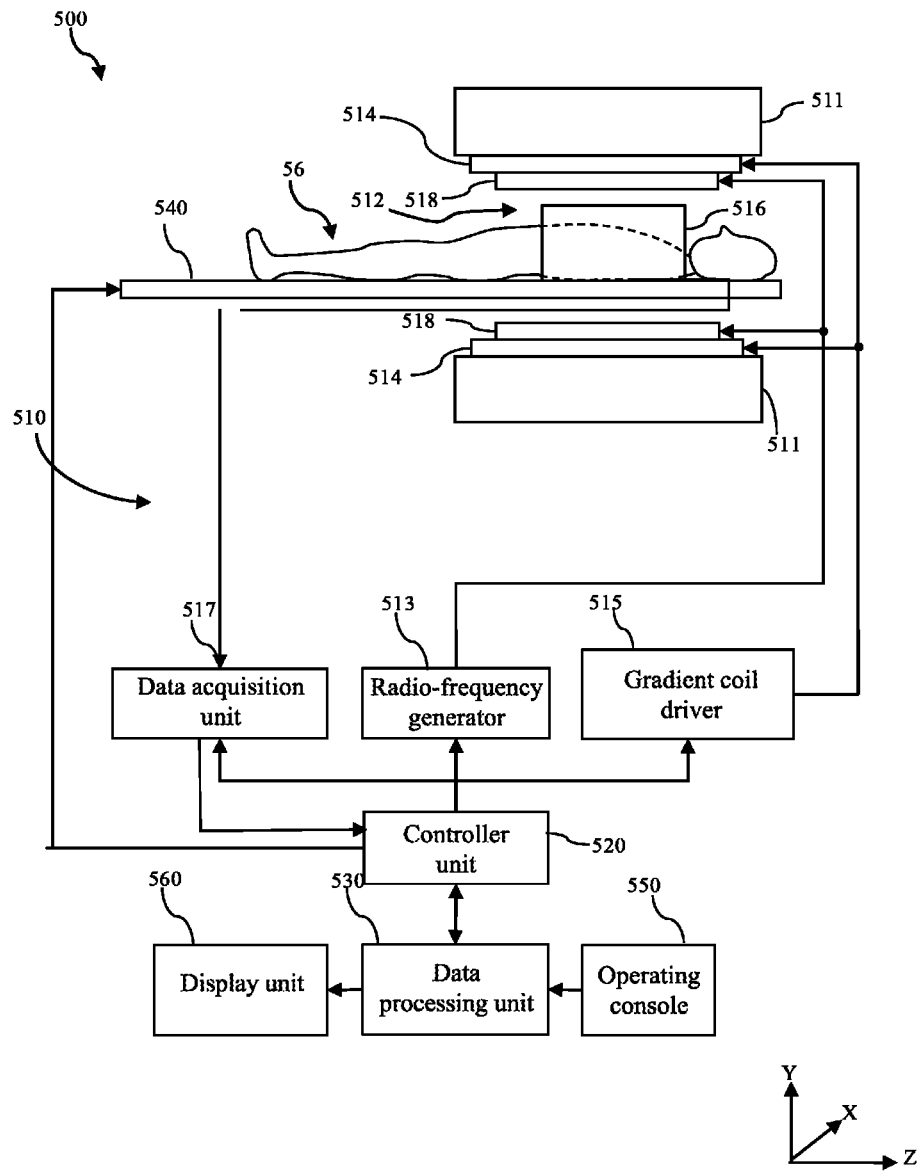
FIG. 5 is a schematic structural diagram of a magnetic resonance imaging system.

FIG. 5 is a schematic structural diagram of a magnetic resonance imaging system, through which the aforementioned magnetic resonance imaging method can be implemented. The system shown in FIG. 5 is described merely as an example. The system may have a variety of transformations in other embodiments.

As shown in FIG. 5, the magnetic resonance imaging system 500 includes at least a scanner 510, a controller unit 520, and a data processing unit 530. The scanner 510 may be configured to obtain data of an object when performing pre-scanning or formal scanning on the object. The controller unit 520 is coupled to the scanner 510 and configured to control the operation of the scanner 510, for example, control the scanner 510 to perform the aforementioned first sequence and second sequence on a plurality of slices to obtain image data of an object 56 when pre-scanning the object 56. The data processing unit 530 is configured to process the obtained image data to calculate formal scanning parameters suitable for each slice in formal scanning.

Specifically, the controller unit 520 is configured to control the scanner to perform pre-scanning, where in the pre-scanning, a first sequence and a second sequence are separately performed on a plurality of slices; in the first sequence, two echoes are successively obtained to respectively obtain first image data and second image data having a first phase offset; and in the second sequence, two echoes are successively obtained to respectively obtain third image data and fourth image data having a second phase offset, the first phase offset and the second phase offset having opposite directions but the same angle.

Specifically, the controller unit 520 may send a sequence control signal to relevant components of the scanner 510 (for example, a radio-frequency generator and a gradient coil driver that will be described below) through a sequence generator (not shown), so that the scanner 510 performs the first sequence and the second sequence.

The data processing unit 530 is configured to obtain a plurality of radio-frequency field maps respectively corresponding to the plurality of slices based on the first image data and the second image data, and obtain a plurality of static magnetic field maps respectively corresponding to the plurality of slices based on at least one of the following two groups: the first image and the third image, and the second image and the fourth image.

The data processing unit 530 further calculates formal scanning parameters suitable for a corresponding slice based on at least one of the following two components: each radio-frequency field map, and a corresponding static magnetic field map.

In an example, the scanner 510 may include a main magnet assembly 511. The main magnet assembly 511 usually includes an annular superconducting magnet defined in a housing, where the annular superconducting magnet is mounted in an annular vacuum container. The annular superconducting magnet and the housing thereof define a cylindrical space, namely, the scanning chamber 512 shown in FIG. 5, surrounding the scanning object 56. The scanning chamber 512 defines an imaging area of the magnetic resonance imaging system or at least part of the imaging area. The main magnet assembly 511 generates a constant magnetic field, for example, a static magnetic field B0, in a Z direction of the scanning chamber 512. The magnetic resonance imaging system transmits a static magnetic pulse signal to the scanning object 56 placed in the scanning chamber 512 using the formed static magnetic field B0, so that protons in the body of the object 56 precess in an ordered manner to generate a longitudinal magnetization vector.

As shown in FIG. 5, the scanner 510 further includes an RF transmit coil 518, a radio-frequency generator 513, a gradient coil assembly 514, a gradient coil driver 515, an RF receive coil 516, and a data acquisition unit 517.

The radio-frequency generator 513 is configured to generate a radio-frequency pulse, for example, the radio-frequency transmit pulses 21 and 31 in FIG. 2 and FIG. 3, in response to the control signal of the controller unit 530. The radio-frequency transmit pulse is amplified by (for example, a radio-frequency power amplifier (not shown)) and then applied to the RF transmit coil 518, so that the RF transmit coil 512 emits to the object 16 a radio-frequency field B1 orthogonal to the static magnetic field B0 to excite nuclei in the body of the object 56, and the longitudinal magnetization vector is converted into a transverse magnetization vector.

In an embodiment, the RF transmit coil 518 may be a body coil. The body coil is generally disposed circumferentially along the magnet assembly 511 rather than being coupled to the object 56 by attaching or wrapping. The body coil may be connected to a transmit/receive (T/R) switch (not shown). The transmit/receive switch is controlled so that the body coil can be switched between a transmit mode and a receive mode. In the receive mode, the body coil may be used for receiving a magnetic resonance signal from the object 56. In the prior art, the magnetic resonance signal received by the body coil is usually used to calculate a static magnetic field map, and thus the accuracy is affected by a low signal-to-noise ratio.

After the end of the radio-frequency transmit pulse, a free induction decay signal, namely, a magnetic resonance signal that can be acquired, is generated in the process that the transverse magnetization vector of the object 16 is gradually restored to zero.

After the end of the radio-frequency transmit pulse, a free induction decay signal, namely, a magnetic resonance signal that can be acquired, is generated in the process that the transverse magnetization vector of the object 16 is gradually restored to zero.

The radio-frequency generator 513 may further be configured to generate the aforementioned first phase-shifting pulse 22 and second phase-shifting pulse 32. The first phase-shifting pulse 22 and the second phase-shifting pulse 32 may also be amplified and then applied to the RF transmit coil 518, so that the RF transmit coil 518 transmits a radio-frequency phase-shifting pulse to the object 16. The radio-frequency phase-shifting pulse is not used for exciting nuclei in the body of the object 16, but for producing a phase offset of the magnetic resonance signal. In this way, the data processing unit 530 can calculate the static magnetic field map based on the aforementioned phase offset.

The gradient coil assembly 514, on one hand, forms a varying magnetic field in an imaging space so as to provide three-dimensional position information to the magnetic resonance signal, and on the other hand, generates a compensating magnetic field of the static magnetic field to shim the static magnetic field.

The gradient coil assembly 514 may include three gradient coils. Each of the three gradient coils generates a gradient magnetic field inclined to one of three spatial axes (for example, X-axis, Y-axis, and Z-axis) perpendicular to each other, and generates a gradient field according to imaging conditions in each of a slice selection direction, a phase encoding direction, and a frequency encoding direction. More specifically, the gradient coil assembly 514 applies a gradient field in the slice selection direction (Z direction) of the object 16 so as to select a slice; and in scanning the slice, the RF transmit coil 518 transmits the RF transmit pulse to the slice of the scanning object 56 and excites the slice. The gradient coil assembly 514 then applies a gradient field in the phase encoding direction of the scanning object 56 so as to perform phase encoding on a magnetic resonance signal of the excited slice. The gradient coil assembly 514 then applies a gradient field in the frequency encoding direction of the object 56 so as to perform frequency encoding on the magnetic resonance signal of the excited slice.

The gradient coil driver 515 is configured to provide a suitable current/power to each of the aforementioned three gradient coils in response to the sequence control signal or a shimming control signal sent by the controller unit 520.

The RF receive coil 516 is configured to receive the aforementioned magnetic resonance signal with the three-dimensional position information in response to a coil control signal (for example, which receive coils are selected for turn-on and which channels of the coils are selected for turn-on) of the controller unit 520. Depending on the imaging part, the RF receive coil 516 may include a surface coil array unit attached to the surface of the scanning object 56, and the RF receive coil 516 may further include a surface coil array unit disposed on a side of a table 540 back against the scanning object 56. The RF receive coil 516 is generally positioned at a part of interest sufficiently close to the scanning object 56 so as to receive a magnetic resonance signal with a high signal-to-noise ratio.

The data acquisition unit 517 is configured to acquire the magnetic resonance signal received by the RF receive coil 516 in response to a data acquisition control signal of the controller unit 520. The data acquisition unit 517 may include, for example, a radio-frequency preamplifier, a phase detector, and an analog/digital converter, where the radio-frequency preamplifier is configured to amplify the magnetic resonance signal received by the RF receive coil 516, the phase detector is configured to perform phase detection on the amplified magnetic resonance signal, and the analog/digital converter is configured to convert the phase-detected magnetic resonance signal from an analog signal to a digital signal.

The digitized magnetic resonance signal, as image data, may be processed by the data processing unit 530. For example, the aforementioned static magnetic field map and radio-frequency field map are determined based on the magnetic resonance signal, and scanning parameters in formal scanning are further determined based on the static magnetic field map and radio-frequency field map; for another example, image reconstruction is performed based on the magnetic resonance signal to obtain an image of tissue of interest of the object 56.

As shown in FIG. 5, the magnetic resonance imaging system 500 further includes a table 540, an operating console 550, and a display unit 560.

The table 540 is configured to carry the object 56 and advance in the Z direction to enter or exit the scanning chamber in response to the control of the controller unit 520. For example, the table 540 may position the object 16 at a suitable position of the scanning chamber during scanning, or advance in the scanning chamber in the Z direction.

The controller unit 520 may generate a control signal based on an operation of the user performed via the operating console 550 or some automatic detection results, so as to control, for example, the scanner 510, the data processing unit 530, and the table 540 to perform corresponding operations. The operating console 550 may include a user input device, such as a keyboard and a mouse, where an operator may input various control signals to the controller unit 520 through the user input device.

The display unit 560 may be connected to the operating console 550 to display an operation interface and may further be connected to the data processing unit 530 to display various data or images generated in the data processing process.

The controller unit 520 and the data processing unit 530 may include a computer and a storage medium, where a predetermined control program and a data processing program to be executed by the computer are recorded on the storage medium. The storage medium may include, for example, a ROM, a floppy disk, a hard disk, an optical disk, a magneto-optical disk, a CD-ROM, or a non-volatile memory card.

Figure 6:
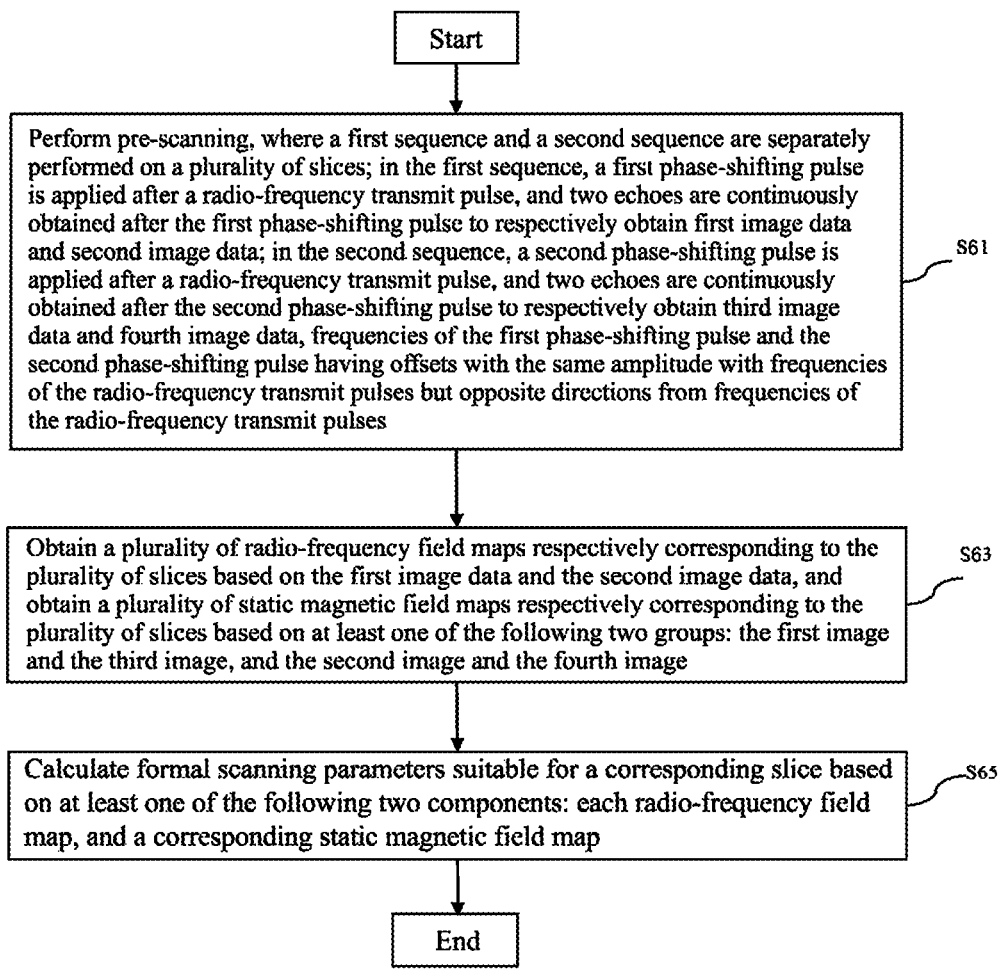
FIG. 6 is a flowchart of a magnetic resonance imaging method according to another embodiment of the present invention.

Referring to FIG. 6, based on the above description, an embodiment of the present invention may further provide a magnetic resonance imaging method, which includes steps S61, S63, and S65.

Step S61: perform pre-scanning, where a first sequence and a second sequence are separately performed on a plurality of slices; in the first sequence, a first phase-shifting pulse is applied after a radio-frequency transmit pulse, and two echoes are continuously obtained after the first phase-shifting pulse to respectively obtain first image data and second image data; in the second sequence, a second phase-shifting pulse is applied after a radio-frequency transmit pulse, and two echoes are continuously obtained after the second phase-shifting pulse to respectively obtain third image data and fourth image data, frequencies of the first phase-shifting pulse and the second phase-shifting pulse having offsets with the same amplitude with frequencies of the radio-frequency transmit pulses but opposite directions from frequencies of the radio-frequency transmit pulses.

Step S63: obtain a plurality of radio-frequency field maps respectively corresponding to the plurality of slices based on the first image data and the second image data, and obtain a plurality of static magnetic field maps respectively corresponding to the plurality of slices based on at least one of the following two groups: the first image and the third image, and the second image and the fourth image.

Step S65: calculate formal scanning parameters suitable for a corresponding slice based on at least one of the following two components: each radio-frequency field map, and a corresponding static magnetic field map.

Based on the above description, an embodiment of the present invention further provides a computer-readable storage medium in which a computer program is stored, where the computer program is used for controlling a magnetic resonance imaging system to perform the magnetic resonance imaging method according to any of the embodiments described above.

In the embodiments of the present invention, in performing pre-scanning, using one slice as an example, two pieces of echo data is continuously acquired within one repetition time of a first sequence corresponding to the slice to generate a first image and a second image, a radio-frequency field map corresponding to the slice is calculated based on the first image and the second image, and a second sequence is performed on the slice, and a static magnetic field map corresponding to the slice may be further calculated based on image data acquired through the first sequence and image data acquired through the second sequence. Thus, two field maps are obtained at the same time in one pre-scanning, and more accurate formal scanning parameters can be obtained based on the generated static magnetic field map and radio-frequency field map, so that an anatomical image of an object obtained by formal scanning has improved fat inhibition effects or other alleviated image quality problems. For example, the image quality problem caused by sensitivity to non-uniformity of a static magnetic field or radio-frequency field.

After accurate formal scanning parameters are obtained for a plurality of slices, formal scanning parameters of other slices can further be obtained through, for example, an interpolation algorithm, so that the aforementioned image quality problems of all slices can be alleviated without excessive scanning resources.

As used herein, an element or step described as singular and preceded by the word "a" or "an" should be understood as not excluding such element or step being plural, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional elements that do not have such property. The terms "including" and "in which" are used as the plain-language equivalents of the respective terms "comprising" and "wherein." Furthermore, in the appended claims, the terms "first", "second," "third" and so on are used merely as labels, and are not intended to impose numerical requirements or a particular positional order on their objects.

This written description uses examples to disclose the present invention, including the best mode, and also to enable those of ordinary skill in the relevant art to implement the present invention, including making and using any devices or systems and performing any incorporated methods. The patentable scope of the present invention is defined by the claims, and may include other examples that occur to those skilled in the art. Such other examples are intended to be within the scope of the claims if they have structural elements that do not differ from the literal language of the claims, or if they include equivalent structural elements without substantial differences from the literal language of the claims.

The invention claimed is:

1. A magnetic resonance imaging method, comprising:
   performing pre-scanning, wherein a first sequence and a second sequence are separately performed on a plurality of slices; in the first sequence, two echoes are continuously obtained to respectively obtain first image data and second image data having a first phase offset; in the second sequence, two echoes are continuously obtained to respectively obtain third image data and fourth image data having a second phase offset, the first phase offset and the second phase offset having opposite directions but the same angle;
   obtaining a plurality of radio-frequency field maps respectively corresponding to the plurality of slices based on the first image data and the second image data, and obtaining a plurality of static magnetic field maps respectively corresponding to the plurality of slices based on at least one of the following two groups: the first image and the third image, and the second image and the fourth image; and
   calculating formal scanning parameters suitable for a corresponding slice based on at least one of the following two components: each radio-frequency field map, and a corresponding static magnetic field map;
   wherein in the first sequence, a first phase-shifting pulse is applied before the echoes; in the second sequence, a second phase-shifting pulse is applied before the echoes; a frequency of the first phase-shifting pulse has a positive offset from a currently used resonant frequency; a frequency of the second phase-shifting pulse has a negative offset from the currently used resonant frequency; and the frequencies of the first phase-shifting pulse and the second phase-shifting pulse have the same offset amplitude as the currently used resonant frequency, so that the third image data and the first image data as well as the fourth image data and the second image data generate phase offsets with opposite directions but the same angle.

2. A magnetic resonance imaging method, comprising:

performing pre-scanning, wherein a first sequence and a second sequence are separately performed on a plurality of slices; in the first sequence, a first phase-shifting pulse is applied after a radio-frequency transmit pulse, and two echoes are continuously obtained after the first phase-shifting pulse to respectively obtain first image data and second image data; in the second sequence, a second phase-shifting pulse is applied after a radio-frequency transmit pulse, and two echoes are continuously obtained after the second phase-shifting pulse to respectively obtain third image data and fourth image data, frequencies of the first phase-shifting pulse and the second phase-shifting pulse having offsets with the same amplitude with frequencies of the radio-frequency transmit pulses but opposite directions from frequencies of the radio-frequency transmit pulses;

obtaining a plurality of radio-frequency field maps respectively corresponding to the plurality of slices based on the first image data and the second image data, and obtaining a plurality of static magnetic field maps respectively corresponding to the plurality of slices based on at least one of the following two groups: the first image and the third image, and the second image and the fourth image; and calculating formal scanning parameters suitable for a corresponding slice based on at least one of the following two components: each radio-frequency field map, and a corresponding static magnetic field map.

3. A magnetic resonance imaging system, comprising:

a scanner;

a controller unit, configured to control the scanner to perform pre-scanning, wherein the pre-scanning comprises: separately performing a first sequence and a second sequence on a plurality of slices; in the first sequence, continuously obtaining two echoes to respectively obtain first image data and second image data having a first phase offset; and in the second sequence, continuously obtaining two echoes to respectively obtain third image data and fourth image data having a second phase offset, the first phase offset and the second phase offset having opposite directions but the same angle; and a data processing unit, configured to: obtain a plurality of radio-frequency field maps respectively corresponding to the plurality of slices based on the first image data and the second image data, obtain a plurality of static magnetic field maps respectively corresponding to the plurality of slices based on at least one of the following two groups: a first image and a third image, and a second image and a fourth image; and calculate formal scanning parameters suitable for a corresponding slice based on at least one of the following two components: each radio-frequency field map, and a corresponding static magnetic field map;

wherein in the first sequence, a first phase-shifting pulse is applied before the echoes; in the second sequence, a second phase-shifting pulse is applied before the echoes; a frequency of the first phase-shifting pulse has a positive offset from a currently used resonant frequency; a frequency of the second phase-shifting pulse has a negative offset from the currently used resonant frequency; and the frequencies of the first phase-shifting pulse and the second phase-shifting pulse have the same offset amplitude as the currently used resonant frequency, so that the third image data and the first image data as well as the fourth image data and the second image data generate phase offsets with opposite directions but the same angle.

4. A magnetic resonance imaging method, comprising:

performing pre-scanning, wherein a first sequence and a second sequence are separately performed on a plurality of slices; in the first sequence, two echoes are continuously obtained to respectively obtain first image data and second image data having a first phase offset; in the second sequence, two echoes are continuously obtained to respectively obtain third image data and fourth image data having a second phase offset, the first phase offset and the second phase offset having opposite directions but the same angle;

obtaining a plurality of radio-frequency field maps respectively corresponding to the plurality of slices based on the first image data and the second image data, and obtaining a plurality of static magnetic field maps respectively corresponding to the plurality of slices based on at least one of the following two groups: the first image and the third image, and the second image and the fourth image;

calculating formal scanning parameters suitable for a corresponding slice based on at least one of the following two components: each radio-frequency field map, and a corresponding static magnetic field map; and obtaining a mask image based on the first image data, the second image data, the third image data, or the fourth image data, and removing data of tissue of no interest in the static magnetic field maps and the radio-frequency field maps based on the mask image; and the step of calculating formal scanning parameters of a corresponding slice comprises: calculating the formal scanning parameters suitable for the slice based on at least one of the following two components: each radio-frequency field map with data of tissue of no interest removed, and the corresponding static magnetic field map.

5. The method according to claim 1, wherein a radio-frequency field map of a corresponding slice is obtained based on one of the following two components: a data difference between the first image data and the second image data, and a data difference between the third image data and the fourth image data.

6. The method according to claim 1, wherein a static magnetic field map of a corresponding slice is obtained based on at least one of the following two components: a data difference between the first image data and the third image data, and a data difference between the second image data and the fourth image data.

7. The method according to claim 1, wherein the calculating formal scanning parameters suitable for a corresponding slice comprises: calculating, based on the static magnetic field map of the corresponding slice, a central frequency and a gradient shimming value suitable for the slice.

8. The method according to claim 1, wherein the calculating formal scanning parameters suitable for a corresponding slice comprises: calculating, based on the radio-frequency field map of the corresponding slice, a transmit gain suitable for the slice.

9. The method according to claim 1 wherein the first phase-shifting pulse and the second phase-shifting pulse are Fermi pulses.

10. The method according to claim 1, wherein the plurality of slices are some slices selected from a series of slices scanned in formal scanning, and the method further comprises: estimating formal scanning parameters of unselected slices based on formal scanning parameters of the selected slices.

11. The method according to claim 10, wherein the formal scanning parameters of the unselected slices are estimated by performing an interpolation algorithm based on the formal scanning parameters of the selected slices.

12. The method according to claim 1, wherein the pre-scanning is performed using reference scanning parameters, and the formal scanning parameters suitable for the corresponding slice are calculated based on the reference scanning parameters and at least one of the following two components: each radio-frequency field map, and the corresponding static magnetic field map.

13. The method according to claim 1, further comprising: obtaining a mask image based on the first image data, the second image data, the third image data, or the fourth image data, and removing data of tissue of no interest in the static magnetic field maps and the radio-frequency field maps based on the mask image; and the step of calculating formal scanning parameters of a corresponding slice comprises: calculating the formal scanning parameters suitable for the slice based on at least one of the following two components: each radio-frequency field map with data of tissue of no interest removed, and the corresponding static magnetic field map.

14. The system according to claim 3, wherein the data processing unit is configured to obtain a radio-frequency field map of a corresponding slice based on one of the following two components: a data difference between the first image data and the second image data, and a data difference between the third image data and the fourth image data.

15. The system according to claim 3, wherein the data processing unit is configured to obtain a static magnetic field map of a corresponding slice based on at least one of the following two components: a data difference between the first image data and the third image data, and a data difference between the second image data and the fourth image data.

16. The system according to claim 3, wherein the data processing unit is configured to calculate, based on the static magnetic field map of the corresponding slice, a central frequency and a gradient shimming value suitable for the slice.

17. The system according to claim 3, wherein the data processing unit is configured to calculate, based on the radio-frequency field map of the corresponding slice, a transmit gain suitable for the slice.

18. The system according to claim 3, wherein the first phase-shifting pulse and the second phase-shifting pulse are Fermi pulses.

19. The system according to claim 3, wherein the plurality of slices are some slices selected from a series of slices scanned in formal scanning, and the data processing unit is configured to estimate formal scanning parameters of unselected slices based on formal scanning parameters of the selected slices.

20. The method according to claim 19, wherein the formal scanning parameters of the unselected slices are estimated by performing an interpolation algorithm based on the formal scanning parameters of the selected slices.

21. The system according to claim 3, wherein the controller unit controls the scanner to perform the pre-scanning using reference scanning parameters, and the data processing unit calculates the formal scanning parameters suitable for the corresponding slice based on the reference scanning parameters and at least one of the following two components: each radio-frequency field map, and the corresponding static magnetic field map.

22. The system according to claim 3, wherein the data processing unit is configured to:

obtain a mask image based on the first image data, the second image data, the third image data, or the fourth image data;

remove data of tissue of no interest in the static magnetic field maps and the radio-frequency field maps based on the mask image; and calculate the formal scanning parameters suitable for the corresponding slice based on at least one of the following two components: each radio-frequency field map with data of tissue of no interest removed, and the corresponding static magnetic field map.

23. A computer-readable storage medium, for storing computer-readable instructions, wherein when the computer-readable instructions are executed, the method according to claim 1 is implemented.

* * * * *